US007579274B2

(12) United States Patent
Gonzalez et al.

(10) Patent No.: US 7,579,274 B2
(45) Date of Patent: Aug. 25, 2009

(54) METHOD AND COMPOSITIONS FOR DIRECT COPPER PLATING AND FILING TO FORM INTERCONNECTS IN THE FABRICATION OF SEMICONDUCTOR DEVICES

(75) Inventors: José Gonzalez, Paris (FR); Hervé Monchoix, Saint-Ismier (FR)

(73) Assignee: Alchimer, Massy (FR)

( * ) Notice: Subject to any disclaimer, the term of this patent is extended or adjusted under 35 U.S.C. 154(b) by 0 days.

(21) Appl. No.: 11/708,293

(22) Filed: Feb. 20, 2007

(65) Prior Publication Data

US 2007/0272560 A1    Nov. 29, 2007

Related U.S. Application Data

(60) Provisional application No. 60/774,675, filed on Feb. 21, 2006.

(51) Int. Cl.
*H01L 21/44* (2006.01)
(52) U.S. Cl. .................. 438/676; 206/291; 206/123; 206/157
(58) Field of Classification Search ................ 438/676; 202/291, 123, 157
See application file for complete search history.

(56) References Cited

U.S. PATENT DOCUMENTS

| 6,664,633 | B1 | 12/2003 | Zhu |
| 6,812,143 | B2 | 11/2004 | Lane et al. |
| 6,849,122 | B1 | 2/2005 | Fair |
| 6,887,522 | B2 | 5/2005 | Sekiguchi et al. |

(Continued)

FOREIGN PATENT DOCUMENTS

JP    2002-285377    10/2002

OTHER PUBLICATIONS

International Search Report for International Publication No. PCT/EP2007/051681 dated May 25, 2007.

(Continued)

*Primary Examiner*—Matthew Smith
*Assistant Examiner*—John M Parker
(74) *Attorney, Agent, or Firm*—Hamre, Schumann, Mueller & Larson, P.C.

(57) ABSTRACT

The object of the present invention is a method and compositions for direct copper plating and filling to form interconnects in the fabrication of semiconductor devices.

According to the invention, this method comprises:
  providing an electrolytic copper bath containing, in solution in a solvent, a source of copper ions with a concentration of between 45 and 200 mM, preferably of between 45 and 100 mM and at least one copper complexing agent which is an aliphatic polyamine having 2 to 4 amine functions with a concentration of between 30 and 200 mM, preferably of between 60 and 200 mM; the copper/complexing agent(s) molar ratio being of between 0.2 and 2, preferably between 0.3 and 1.5;
  bringing said copper diffusion barrier layer of said substrate into contact with said electrolytic copper bath,
  applying an electrical bias to the substrate for a duration adjusted according to the thickness of copper to be electroplated,
  removing the substrate from said electrolytic copper bath.

17 Claims, 1 Drawing Sheet

U.S. PATENT DOCUMENTS

| | | |
|---|---|---|
| 2003/0183527 A1 | 10/2003 | Collins |
| 2004/0022940 A1 | 2/2004 | Nagai et al. |
| 2004/0072419 A1 | 4/2004 | Baskaran et al. |
| 2005/0006245 A1 | 1/2005 | Sun et al. |
| 2005/0145499 A1 | 7/2005 | Kovarsky et al. |
| 2005/0173252 A1 | 8/2005 | Chen |
| 2006/0065536 A1 | 3/2006 | Jentz et al. |

OTHER PUBLICATIONS

GOH et al., "The use of electroless copper seed in electrochemical deposited copper interconnect", Thin Solid Films, vol. 462-463, Sep. 2004. pp. 275-278.

Wolf, "Dual-Damascene Interconnects", Silicon processing for the VLSI Era vol. 4, pp. 671-687.

METHOD AND COMPOSITIONS FOR DIRECT COPPER PLATING AND FILING TO FORM INTERCONNECTS IN THE FABRICATION OF SEMICONDUCTOR DEVICES

The present application claims benefit of U.S. provisional application 60/774,675 filed Feb. 21, 2006.

The present invention generally concerns a method and compositions for direct copper plating and filling to form interconnects in the fabrication of semiconductor devices.

BACKGROUND OF THE INVENTION

Copper metallization has become widely adopted to form the multilevel interconnects required in today's ultra large scale integration (ULSI) semiconductor devices, due to its lower resistivity compared to aluminum and its improved electromigration resistance.

Multilevel interconnects consist in a network of copper lines (also called trenches) that are used to distribute various signals as well as power and ground to different areas of an integrated circuit. In order to be more real estate-efficient, these lines are stacked in several levels separated by a dielectric material and levels are connected to each other through vertical apertures called vias.

Lines and vias are formed using the damascene process sequence [See for example S. Wolf: "Silicon processing for the VLSI Era", Vol. 4, p. 671-687] in which, at each level of the interconnect system, features are etched in the dielectric material and subsequently filled with copper before being planarized. A simplified version of this sequence can be described by:

- dry etching of the dielectric material to form trenches and/or vias
- deposition (conventionally by physical vapor deposition—PVD) of a Cu diffusion barrier (usually TaN/Ta) since copper is a fast diffuser and, during processing, could reach the underlying transistors built into silicon, causing device failures.
- deposition of a "seed layer" of copper conventionally by PVD; this layer being required to overcome the high resistivity of the diffusion barrier layer onto which traditional copper electroplating processes produce non-contiguous three-dimensional clusters of Cu rather than a uniform film [See U.S. patent application 2005145499]
- electrochemical deposition (electroplating) of copper to fill the vias and trenches.
- planarization by chemical mechanical polishing (CMP) to leave copper lines inlaid in the dielectric. A robust formation technique for these lines and vias is required to ensure reliability of the ULSI devices.

As device integration density increases, the width of lines, vias and other features on the circuits decreases, whereas the height or distance within and between the different levels remains fairly constant. As a result, the aspect ratio of the lines and vias, defined as their height-to-width ratio, tends to increase, making it difficult to fill them with copper.

These increasingly shrinking dimensions are a serious problem when physical deposition processes such as PVD have to be used as it is the case for the seed layer deposition in the damascene sequence. The copper seed layer, must be conformal and continuous even at very low thicknesses (around 10 nm) to ensure a proper gap filling by copper electroplating.

The PVD techniques are inherently directional and thus do not have adequate step coverage to meet these requirements for small features and/or for high aspect ratios. For example, a PVD process results in additional material to be deposited at the top corners of narrow features (overhang effect). This constriction of the feature width prior to copper electroplating makes achieving complete gapfill very challenging. Moreover, because of their dimensions, small features require ultra-thin seed layers (10 nm and below). This thickness requirement combined with the poor conformality of PVD processes result in discontinuities in the seed layer which appear on the feature sidewalls leading to defective and incomplete copper gap filling.

Alternate deposition techniques such as chemical vapor deposition (CVD) or atomic layer deposition (ALD) can be used to deposit a copper seed layer [see U.S. Pat. Nos. 6,887,522 and 6,849,122] but these processes still suffer from some type of overhang effect and they are prone to produce poor adhesion of copper to the underlying barrier layer due to the use of fluorine-containing precursors, thus compromising device yield.

These CVD and ALD processes cannot be used for filling features as their deposition rate is very low, making them incompatible with the high productivity environment of semiconductor device manufacturing.

Electroless copper deposition directly on the barrier material has been proposed to fill features. However, an extra activation step is often required and adhesion is also a problem. (See W. L. Goh and K. T. Tan "the use of electroless copper seed in electrochemical deposited copper interconnect", Thin Solid Films, vol. 462-463, September 2004, p. 275-278).

For direct plating and filling, changing the diffusion barrier material to make it less resistive and more compatible with electroplating with traditional copper plating chemistries, has also been proposed [see U.S. Pat. No. 6,812,143]. This approach has the disadvantage of introducing a new material and requires significant rework of some of the processes of the damascene sequence.

As feature dimensions decrease, the use of seed layers will more significantly contribute to increase the effective aspect ratio and make gap filling by copper electroplating even more difficult, if merely possible.

An electrolytic copper bath capable of forming a seed layer of copper is normally not usable for gap filling since it generally leads to an inappropriate coating with the formation of a filling defect known as a "seam" (a central notch in the via, appearing when the filling gradient occurs predominantly from the lateral walls of the via). Such a seam may cause a structural weakness due to a locally low copper density. Furthermore, the seam may be a diffusion path for contaminants (said contaminants may for example be due to the use of chemical polishing solutions). Alternatively, traditional electroplating baths, such as those which are being used to fill up trenches after a copper seed step, cannot afford uniform coverage starting directly on the barrier material, due to ohmic drop effects: existing copper electroplating bath are indeed designed to perform bottom-up copper growth on a conductive surface. Last, filling trenches in a single step constitutes a difficult challenge as one is actually seeking the process to start as a conformal deposition, in order to avoid overhang and/or discontinuities, and then to continue in a non-conformal or bottom-up growth to secure complete seamless filling.

A gap fill capable single step electroplating performed directly on the diffusion barrier material would thus alleviate the above issues and constitute a solution not necessarily straightforward to the skilled person.

In addition, one should note that such a process would bring productivity gains as one single tool could be used to perform a sequence (seed deposition followed by trench/via filling) which today requires two equipments i.e. one for seed deposition and one for copper plating. This latter merit also suggests that the above-mentioned technical elements regarding the shrinking of dimensions are optional to motivate the introduction of the object of the present invention in manufacturing, and that this invention should be appealing from a cost standpoint alone.

Due to the limitations described above, there is a clear need for a process which can, in a single process step, using a single chemical bath: (1) directly plate copper onto the diffusion barrier regardless of its nature, and in particular onto the industry standard Ta based barriers, with good adhesion and (2) fill the features i.e. without using a copper seed layer and at a rate usable in manufacturing.

SUMMARY OF THE INVENTION

The present invention addresses the above mentioned issue of plating and filling features with copper directly on a copper diffusion barrier without the prior formation of a copper seed layer.

In accordance with the present invention, it has been discovered that a single electrolytic copper bath may be used to electroplate copper directly onto a copper diffusion barrier material which can be pre-treated or not, with the resulting copper film completely filling, without any defects such as "seam", the trenches, vias and other features previously covered with the barrier material. It has been found surprisingly that the copper thus deposited exhibits low resistivity after annealing and strong adhesion to the underlying barrier. Low resistivity is particularly advantageous to ensure low signal propagation delays and good adhesion is particularly advantageous to ensure good electromigration resistance. It has also been found surprisingly that said electrolytic copper bath allows gap filling to be reached after a relatively short deposition time which is compatible with industrial process requirements.

DETAILED DESCRIPTION

Figure 1:
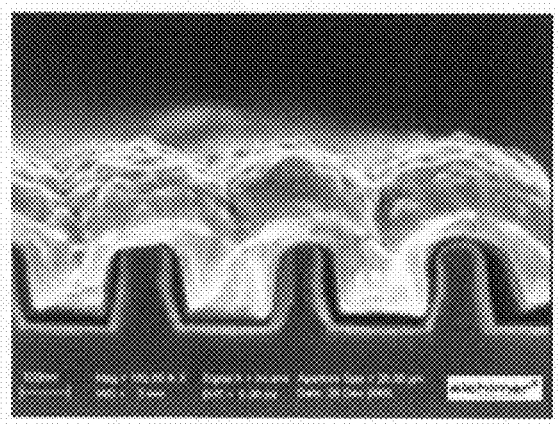
FIG. 1 is a SEM sectional view of a trench pattern filled with copper, prepared in one example of this present invention.

The present invention can advantageously be used to electroplate on various diffusion barrier materials conventionally used for copper interconnects in microelectronics (tantalum, tantalum nitride, titanium, titanium nitride, tungsten, tungsten nitride, tungsten carbide, cobalt, ruthenium and the like).

According to a first aspect, the invention is directed to an electrolytic copper bath which generally comprises: a copper source, at least one specifically choosen complexing agent and optionally additives used to assist in filling.

More specifically, the electrolytic copper bath of the invention contains, in solution in a solvent, a source of copper ions with a concentration of between 45 and 200 mM, preferably of between 45 and 100 mM and at least one copper complexing agent which is an aliphatic polyamine having 2 to 4 amine functions with a concentration of between 30 and 200 mM, preferably of between 60 and 200 mM; the copper/complexing agent(s) molar ratio being of between 0.2 and 2, preferably between 0.3 and 1.5.

A preferred electrolytic copper bath according to the invention essentially contains, in solution in a solvent, a source of copper ions with a concentration of between 45 and 100 mM, preferably of between 50 and 80 mM and at least one copper complexing agent which is an aliphatic polyamine having 2 to 4 amine functions with a concentration of between 60 and 200 mM, preferably of between 90 and 180 mM; the copper/complexing agent(s) molar ratio being of between 0.3 and 1.5, preferably between 0.4 and 0.8.

The electrolytic copper bath of the invention contains one or more specific complexing agents which are selected from the group of aliphatic polyamines having two to four amine functions. It has been found that such complexing agents are unique in that they allow copper plating and filling to be reached in a single step of an electroplating method. Importantly enough, formulations containing these agents result in a rate of deposition which is usable in manufacturing, i.e. a deposition time of a few minutes, which is shorter than the sum of deposition times of the seed and electroplating steps. It has been observed that the invention allows a deposition time to be achieved which is of the order of at least 100 nm/min.

The term "polyamine" is understood to mean here an organic compound having at least two primary amino groups —$NH_2$.

Preferred aliphatic polyamines which can be used as a complexing agent according to the invention are selected from the group consisting of alkylene-polyamines and polyalkylene-polyamines having 2 to 4 amine functions preferably from the group consisting of ethylenediamine, diethylenetriamine, triethylenetetramine, and dipropylenetriamine.

In the framework of the invention, particularly preferred aliphatic polyamines are ethylenediamine and diethylenetriamine.

Excellent results have been obtained in particular with bath compositions in which the aliphatic polyamine is ethylenediamine present with a concentration of about 95 to 160 mM.

Excellent results have also been obtained in particular with bath compositions in which the aliphatic polyamine is diethylenetriamine present with a concentration of about 160 mM.

In general, the electrolytic copper bath of the invention contains a source of copper ions, in particular cupric ($Cu^{2+}$) ions.

Advantageously, the aforementioned source of copper ions is a copper salt such as in particular copper sulphate, copper chloride, copper nitrate or copper acetate, preferably copper sulphate.

A particularly preferred source of copper ions is copper sulfate pentahydrate.

Excellent results have been obtained in particular with bath compositions in which the source of copper ions is copper sulfate pentahydrate present with a concentration of 65 mM.

In general, the electrolytic copper bath of the invention contains a solvent.

Although in principle there is no restriction on the nature of the solvent (provided that it appropriately dissolves the active species of the bath and does not interfere with the electroplating), water or a hydroalcoholic solution will be preferred.

Depending on the complexing agent, the electrolytic copper bath of the invention can be acidic or alkaline. The pH value of the bath could be adjusted by adding conventional pH-adjustment additives. However, this is in general not necessary.

Organic additives such as accelerators and suppressors can optionally be used in the electrolytic bath of the invention to increase the plating rate of the features compared to planar surfaces. For instance, chloride ions in combination with polyethers such as polyethyleneglycols can be used as suppressor. A commercially available suppressor such as Nanoplate™ C-3200 from Rohm & Haas Electronic Materials L.L.C. (Marlborough, Mass., USA) can also be used with the electrolytic bath of the invention. For instance also sulfur-based organic molecules such as bis(sodiumsulfopropyl) disulfide (SPS) can be used as accelerator. A commercially available accelerator such as Nanoplate™ B-3200 from Rohm & Haas Electronic Materials L.L.C. (Marlborough, Mass., USA) can also be used with the electrolytic bath of the invention.

Other additives such as leveling agents and wetting agents can optionally be used in the electrolytic bath of the invention to enhance the quality of the plated film.

According to a second aspect, the invention is directed to a process or method for electroplating copper directly onto a copper diffusion barrier layer deposited on a patterned substrate and, in the same step of the method, filling the surface features of the patterned substrate with copper.

According to this method, a substrate surface coated with a copper diffusion barrier material is immersed in the electrolytic copper bath of the invention as generally described above. The substrate is electrically connected and polarized in such a way that the barrier surface is electrically biased for a period of time dependent on the desired copper film thickness.

More specifically, the method according to the invention comprises:
  providing an electrolytic copper bath containing, in solution in a solvent, a source of copper ions with a concentration of between 45 and 200 mM, preferably of between 45 and 100 mM and at least one copper complexing agent which is an aliphatic polyamine having 2 to 4 amine functions with a concentration of between 30 and 200 mM, preferably of between 60 and 200 mM; the copper/complexing agent(s) molar ratio being of between 0.2 and 2, preferably between 0.3 and 1.5;
  bringing said copper diffusion barrier layer of said substrate into contact with said electrolytic copper bath,
  applying an electrical bias to the substrate for a duration adjusted according to the thickness of copper to be electroplated,
  removing the substrate from said electrolytic copper bath.

According to one embodiment of the process of the present invention, a substrate surface coated with a diffusion barrier material is immersed in the electrolytic copper bath of the invention. This immersion can be carried out with no electrical bias applied to the surface to be coated (cold entry) or with an electrical bias having the same polarity as the bias used for deposition (hot entry).

During the coating formation step, the substrate is electrically connected and polarized in such a way that the barrier surface is cathodically biased for a period of time sufficient to form the desired coating. This period of time may be easily determined by a person skilled in the art, the growth of the film being a function of the charge, which is equal to the time integral of the electric current flowing in the circuit over the deposition time (Faraday's law).

At the end of the coating step, the substrate is removed from the electrolytic copper bath. This removal step can be performed either with no bias applied to the surface (cold exit) or with an electrical bias of any polarity (hot exit).

During the step of forming the coating, the surface to be coated is cathodically biased. More specifically, this can be accomplished through different current or potential waveforms.

For example, the surface can be cathodically biased continuously either in galvanostatic mode (with a constant bias current) or in potentiostatic mode (with a constant bias potential, optionally relative to a reference electrode).

In general, a satisfactory coating and filling can be obtained by biasing in galvanostatic mode preferably within the current range from 2 mA/cm$^2$ (milliamps per square centimetre) to 25 mA/cm$^2$, and more particularly from 4 mA/cm$^2$ to 15 mA/cm$^2$.

A satisfactory coating may also be obtained by biasing in potentiostatic mode, by applying a cell voltage in such a way that the resulting cell current remains within the same current range as previously indicated. Although the cell voltage depends in particular on cell design parameters, such as the distance from the counterelectrode or the presence of a membrane, it will be easy for a person skilled in the art to determine the cell voltage by measuring and adjusting the current obtained for a given potential and a given configuration.

The surface can also be cathodically biased in a sequence of galvanostatic or potentiostatic steps of different magnitude as taught by U.S. Patent Application 2006/0065,536, incorporated herein by reference.

The surface to be coated can also be cathodically biased in pulsed mode (either the current or the potential being pulsed). In this case, the electrical bias may have the form of a series of periodic pulses of current or potential, such as rectangular pulses, having a magnitude depending on the barrier material, its thickness and the substrate size, these pulses being advantageously separated by time intervals where no bias is applied.

A satisfactory coating may also be obtained by biasing in pulse mode, preferably so as to impose monopolar (cathodic) voltage pulses.

In general, this step may be carried out so as to impose voltage pulses corresponding to a current per unit area within the range from 2 mA/cm$^2$ to 40 mA/cm$^2$, and more particularly from 4 mA/cm$^2$ to 25 mA/cm$^2$ separated by time intervals where no biasing is applied.

According to one particular feature, the duration of bias may be between 0.001 and 1 second, for example around 0.5 second, whereas the duration of the time interval where no bias is applied may be between 0.001 and 5 seconds, for example around 1.5 seconds.

The number of cycles to be performed during this step depends on the expected thickness of the coating.

In general, a person skilled in the art will readily determine the number of cycles to be performed knowing that, under the aforementioned general conditions, illustrated by the examples below, it has been observed that the deposition rate is about 1 nm per cycle.

In one embodiment, each periodic cathodic pulse may last between 1 ms and 1 s and may be separated from the next one by a duration of 1 ms to 5 s where no electrical bias is applied to the substrate.

Other more complex waveforms can be used to take advantage of improved filling performance, especially for narrow lines and small vias (less than 80 nm).

One waveform of particular interest is called reverse pulse and is described in detail in U.S. Pat. No. 6,664,633 and also in U.S. Patent Application 2003/183,527 incorporated herein by reference.

In this type of waveform, a series of alternating cathodic and anodic current or potential pulses is applied to the surface to be coated. Generally, the anodic pulses have lower magnitude and shorter duration compared to cathodic pulses. Cathodic and anodic pulses may or may not be separated by time intervals where no bias is applied to the surface to be coated.

During cathodic biasing, copper is deposited on the surface to be coated from the electrolytic copper bath of the invention.

During anodic biasing, some copper is removed from the previously deposited layer. This removal occurs preferentially on protruding corners at the top of features thereby enlarging the top aperture of the features. This allows improved filling properties especially in smaller features.

On flat surfaces, the anodic pulses have a polishing effect leading to bright copper deposits.

A satisfactory coating may also be obtained by biasing in pulse reverse mode, preferably so as to impose bipolar (cathodic and anodic) voltage pulses.

In general, this step may be carried out so as to impose a series of voltage pulses corresponding to a maximum cathodic current per unit area within the range from 2 mA/cm$^2$ to 40 mA/cm$^2$, and more particularly from 4 mA/cm$^2$ to 25 mA/cm$^2$ separated by anodic voltage pulses corresponding to a maximum anodic current per unit area within the range from 0.4 mA/cm$^2$ to 1 mA/cm$^2$. There may be time intervals where no bias is applied between the cathodic and anodic pulses. The duration of these time intervals may be between 0.001 and 5 seconds.

The number of cycles to be performed during this step depends on the expected thickness of the coating.

In general, a person skilled in the art will readily determine the number of cycles to be performed knowing that, under the aforementioned general conditions, illustrated by the examples below, it has been observed that the deposition rate is about 1 nm per cycle.

In one particular embodiment the method of the present invention for electroplating copper on the surface (made of a copper barrier material) of a patterned substrate comprises:
- a step referred to as "cold entry" during which the said surface to be coated is brought into contact with the electrolytic bath while the said surface is not under electrical bias;
- a step of forming the coating during which the said surface is biased for a time long enough to form the said coating;
- a step referred to as "hot exit" during which the said surface is separated from the electrolytic bath while it is still under electrical bias.

During the "cold entry" step of the method according to this embodiment of the invention, the surface of the substrate to be coated is preferably kept in contact with the electrolytic bath for a period of at least 5 seconds, preferably between 10 and 60 seconds and more preferably about 30 seconds.

During the "hot exit" step of the method according to the invention, the substrate surface coated with the copper is removed from the electroplating bath while under electrical bias preferably for a period of between 1 and 10 seconds, more preferably for a period of about 1 to 5 seconds.

Advantageously, the "hot exit" step is carried out in potentiostatic mode, that is to say by keeping the electric potential of the substrate at a fixed value, this potential being measured either relative to the counterelectrode of the circuit or relative to a reference electrode, preferably at the same voltage level as during the coating deposition step when this is also carried out in potentiostatic mode.

In one other particular embodiment the method of the present invention, the entry steep is a "hot entry" where the substrate is immersed in the electrolytic copper bath under electrical bias applied to it.

According to a third aspect, the invention is directed to the use of the electrolytic copper bath of the invention for electroplating copper directly onto a copper diffusion barrier layer deposited on a patterned substrate and, in the same step of the method, filling the surface features of the patterned substrate with copper.

In one embodiment, the substrate is a silicon wafer in the course of fabricating integrated circuits, the surface of which, to be coated, is that of a copper diffusion barrier layer selected from the group consisting of a bilayer based on tantalum nitride/tantalum (TaN/Ta), a tantalum nitride (TaN) layer, a tantalum silicon nitride (TaSiN) layer, a titanium (Ti) layer, a titanium nitride (TiN) layer, a titanium silicon nitride (TiSiN) layer, a tungsten nitride (WN) layer, a tungsten carbon nitride (WCN) layer, a cobalt-based layer and a ruthenium-based layer.

The present invention will now be illustrated by the following non-limiting examples in which the method according to the invention is used to plate and fill copper on silicon substrates coated with a copper diffusion barrier layer. This method is especially applicable in the fabrication of copper interconnect structures for integrated circuits and semiconductor devices.

It should be noted that in these examples, bath compositions contains only water (optionally with a water-soluble alcohol), a copper source and complexing agent(s) and are sufficient to obtain good results (gap filling, good adherence and low resistivity, high rate). Of course, additional additives (usually used to assist in filling and/or to modify the pH) may further be added.

It should also be noted that the copper can directly be deposited onto untreated barrier layers (as is the case in the following examples). However, the invention is not limited to the deposition onto untreated barrier layers. In some cases, it could be suitable to first modify the barrier layers (forming gas anneal, electrolytic treatment, acid treatment, electrochemical treatment).

EXAMPLE 1

The substrate used in this example consisted of a silicon workpiece, coated with a 400 nm layer of silicon dioxide deposited by plasma-enhanced chemical vapor deposition (PECVD). The silicon dioxide layer was coated with a layer of tantalum nitride (TaN) having a thickness of 10 nm deposited by PVD on top of which a layer of tantalum (Ta) having a thickness of 15 nm was also deposited by PVD.

This TaN/Ta stack is a copper diffusion barrier such as those used in damascene structures. The sheet resistance of this barrier stack was 21 ohm/square.

A blanket substrate was used for sheet resistance (Rs) measurement by 4-point probe. Adhesion on a blanket substrate was measured by a variable force stud-pull test. A trench-patterned substrate (trench width 200 nm/spacing 100 nm) having the same underlayers as the blanket substrate was used for gap-filling evaluation. Gap fill was observed by scanning electron microscope (SEM) cross-sectional imaging.

These substrates were used without any pre-treatment.

The electrolytic copper bath of the invention in this particular example was an aqueous solution containing $CuSO_4$, $(H_2O)_5$ with a concentration of 65 mM, and ethylenediamine with a concentration of 160 mM. The pH of this solution was 11.

Equipment

The cell used for the electrolytic deposit was a glass cell made up of two parts: the cell intended to contain the solution for electrodeposition and a "lid" which makes it possible to maintain the various electrodes in position, as well as to supply argon for consistent hydrodynamics within the solution.

Connectors allowed contacting the electrode by electrical wires to a stabilized power supply providing a maximum of 32 volts and 5 amperes.

Experimental Protocol

The substrate was immersed in the electrolytic copper bath and the following three-step protocol was performed:

1) Induction or cold entry: the substrate was immersed in the electrolytic copper bath during 30 seconds without any electrical bias applied to it.

2) Application of periodic rectangular pulsed potential with a period of 1.25 seconds (0.75 s off and 0.5 s on) between 0 V and −15 V.

3) Hot exit: the substrate was taken out from the copper electrolytic bath under electrical bias at a level equal to the pulse bias.

Results

By performing the above experimental protocol on a blanket substrate, we obtained a continuous and uniform copper layer with a thickness of 480 nm, a growth rate of 2 nm/s and a sheet resistance Rs of 0.05 ohm/square as-deposited.

After an anneal at 350° C. during 5 minutes in 4% $H_2$/96% $N_2$ forming gas, the adhesion value of the copper layer was 13.4 $J/m^2$.

As shown in FIG. 1, which is a SEM cross-section image of a trench pattern (trench width 200 nm/spacing 100 nm) lined with a PVD TaN/Ta diffusion barrier and filled with copper according to the method of the invention performed on a trench patterned substrate, defect-free gap-filling of the structures was obtained, with a deposited thickness of 200 nm.

EXAMPLE 2

The substrate used in this example consisted of a silicon workpiece, coated with a 400 nm layer of silicon dioxide deposited by plasma-enhanced chemical vapor deposition (PECVD). The silicon dioxide layer was coated with a layer of ruthenium (Ru) having a thickness of 30 nm deposited by PVD. The sheet resistance of this ruthenium layer was 8.5 Ohm/square.

A blanket substrate was used for sheet resistance (Rs) measurement by 4-point probe. Adhesion on a blanket substrate was measured by a variable force stud-pull test.

These substrates were used without any pre-treatment.

The electrolytic copper bath of the invention in this particular example was an aqueous solution containing $CuSO_4$, $(H_2O)_5$ with a concentration of 65 mM, and ethylenediamine with a concentration of 160 mM. The pH of this solution was 11.

Equipment

The cell used for the electrolytic deposit was a glass cell made up of two parts: the cell intended to contain the solution for electrodeposition and a "lid" which makes it possible to maintain the various electrodes in position, as well as to supply argon for consistent hydrodynamics within the solution.

Connectors allowed contacting the electrode by electrical wires to a stabilized power supply providing a maximum of 32 volts and 5 amperes.

Experimental Protocol

The substrate was immersed in the electrolytic copper bath and the following three-step protocol was performed:

1) Induction or cold entry: the substrate was immersed in the electrolytic copper bath during 30 seconds without any electrical bias applied to it.

2) Application of periodic rectangular pulsed potential with a period of 1.25 seconds (0.75 s off and 0.5 s on) between 0 V and −12 V.

3) Hot exit: the substrate was taken out from the copper electrolytic bath under electrical bias at a level similar to the pulse bias.

Results

By performing the above experimental protocol on a blanket substrate, we obtained a continuous and uniform copper layer with a thickness of 700 nm, a growth rate of 2.33 nm/s and a sheet resistance Rs of 0.028 ohm/square as-deposited.

After an anneal at 350° C. during 5 minutes in 4% $H_2$/96% $N_2$ forming gas, there was no peeling of the copper layer with the scotch tape test, indicative of an adhesion value in excess of 15 $J/m^2$. After anneal the Rs value was improved by approximately 20 % at 0.022 ohm/square.

EXAMPLE 3

The substrate used in this example consisted of a silicon wafer of diameter 200 mm, coated with a 400 nm layer of silicon dioxide deposited by plasma-enhanced chemical vapor deposition (PECVD). The silicon dioxide layer was coated with a layer of tantalum nitride (TaN) having a thickness of 15 nm deposited by PVD on top of which a layer of tantalum (Ta) having a thickness of 10 nm was also deposited by PVD.

This TaN/Ta stack is a copper diffusion barrier such as those used in damascene structures. The sheet resistance of this barrier stack was 45 ohm/square.

A blanket substrate was used for sheet resistance (Rs) measurement by 4-point probe. Adhesion on a blanket substrate was measured by a scotch tape test. A trench-patterned substrate (trench width 200 nm/spacing 100 nm) having the same underlayers as the blanket substrate was used for gap-filling evaluation. Gap fill was observed by focused ion beam (FIB) and SEM cross-sectional imaging.

These substrates were used without any pre-treatment.

The electrolytic copper bath of the invention in this particular example was an aqueous solution containing $CuSO_4$, $(H_2O)_5$ with a concentration of 65 mM, and ethylenediamine with a concentration of 95 mM. The pH of this solution was 6.

Equipment 200 mm wafers were processed in an industrial tool commercialized for copper electroplating applications. This tool was equipped with an electrochemical cell having its own solution circulation system. The electrochemical cell houses a copper anode and a diffuser installed between the anode and the wafer which is the cathode. A sealed ring was used to provide current to the wafer. This current was delivered by a power supply unit capable of delivering (32V, 5 A) maximum.

After copper deposition, the wafer was cleaned in a SRD (spin rinse dry) chamber located on the same tool.

Experimental Protocol

The substrate was immersed in the electrolytic copper bath and the following three-step protocol was performed:

1) Hot entry: the substrate was immersed in the electrolytic copper bath with electrical bias applied to it.

2) Application of a constant potential of 32V.

3) Hot exit: the substrate was taken out from the copper electrolytic bath under electrical bias at a level similar to the pulse bias.

Results

By performing the above experimental protocol on a blanket substrate, we obtained a continuous and uniform copper layer with a mean thickness of 480 nm, a growth rate of 4 nm/s and an average sheet resistance, Rs, of 0.056 ohm/square as-deposited.

Wafers tested for adhesion after anneal at 400° C. for 30 minutes passed the scotch tape test.

Figure 2:
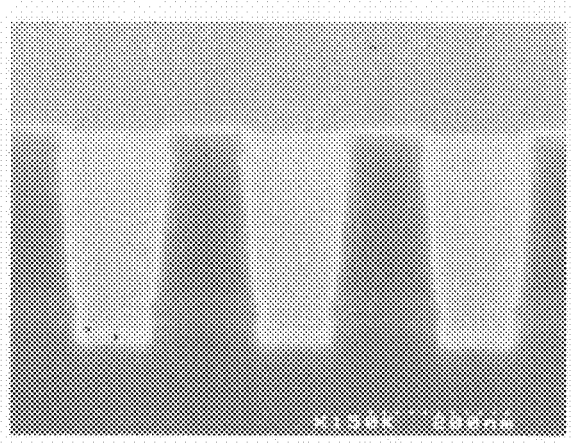
FIG. 2 is a SEM sectional view of a trench pattern filled with copper, prepared in accordance with another example of the present invention.

As shown in FIG. 2, which is a SEM cross-section image after Chemical Mechanical Polishing) (CMP) of a trench pattern (trench width 140 nm/spacing 140 nm) lined with a PVD TaN/Ta diffusion barrier and filled with copper according to the method of the invention performed on a trench patterned substrate, defect-free gap-filling of the structures was obtained.

EXAMPLE 4

The substrate used in this example consisted of a silicon workpiece, coated with a 400 nm layer of silicon dioxide deposited by plasma-enhanced chemical vapor deposition (PECVD). The silicon dioxide layer was coated with a layer of tantalum nitride (TaN) having a thickness of 10 nm deposited by PVD on top of which a layer of tantalum (Ta) having a thickness of 15 nm was also deposited by PVD.

This TaN/Ta stack is a copper diffusion barrier such as those used in damascene structures. The sheet resistance of this barrier stack was 21 ohm/square.

A blanket substrate is used for sheet resistance (Rs) measurement by 4-point probe. Adhesion on a blanket substrate was measured by a variable force stud-pull test.

These substrates were used without any pre-treatment.

The electrolytic copper bath of the invention in this particular example was an aqueous solution containing $CuSO_4$,$(H_2O)_5$ with a concentration of 65 mM, and diethylenetriamine with a concentration of 160 mM. The pH of this solution was 11.

Equipment

The cell used for the electrolytic deposit was a glass cell made up of two parts: the cell intended to contain the solution for electrodeposition and a "lid" which made it possible to maintain the various electrodes in position, as well as to supply argon for consistent hydrodynamics within the solution.

Connectors allowed contacting the electrode by electrical wires to a stabilized power supply providing a maximum of 32 volts and 5 amperes.

Experimental Protocol

The substrate was immersed in the electrolytic copper bath and the following three-step protocol was performed:

1) Induction or cold entry: the substrate was immersed in the electrolytic copper bath during 30 seconds without any electrical bias applied to it.

2) Application of periodic rectangular pulsed potential with a period of 1.25 second (0.75 s off and 0.5 s on) between 0 V and −10 V.

3) Hot exit: the substrate was taken out from the copper electrolytic bath under electrical bias at a level similar to the pulse bias.

Results

By performing the above experimental protocol on a blanket substrate, we obtained a continuous and uniform copper layer with a thickness of 450 nm, a growth rate of 1.9 nm/s and a sheet resistance Rs of 0.12 ohm/square as-deposited.

After an anneal at 350° C. during 5 minutes in 4% $H_2$/96% $N_2$ forming gas, the adhesion value was 5 $J/m^2$.

EXAMPLE 5

The substrate used in this example consisted of a 200 mm silicon wafer, coated with a 400 nm layer of silicon dioxide deposited by plasma-enhanced chemical vapor deposition (PECVD). The silicon dioxide layer was coated with a layer of tantalum nitride (TaN) deposited by PVD, having a thickness of 15 nm.

This TaN layer having a mean sheet resistance of 100 ohm/square, constituted a copper diffusion barrier such as those used in damascene structures.

A blanket substrate was used for sheet resistance (Rs) measurement by 4-point probe. Adhesion on a blanket substrate was measured by a variable force stud-pull test. These substrates were used without any pre-treatment.

The electrolytic copper bath of the invention in this particular example was an aqueous solution having a pH of 6, containing $CuSO_4$,$(H_2O)_5$ with a concentration of 65 mM, and ethylenediamine with a concentration of 95 mM.

Equipment 200 mm wafers were processed in an industrial tool commercialized for copper electroplating applications. This tool was equipped with an electrochemical cell having its own solution circulation system. The electrochemical cell housed a copper anode and a diffuser installed between the anode and the wafer which is the cathode. A sealed ring was used to provide current to the wafer. This current was delivered by a power supply unit capable of delivering (32V, 5 A) maximum.

After copper deposition, the wafer was cleaned in a SRD (spin rinse dry) chamber located on the same tool.

Experimental Protocol

The substrate was immersed in the electrolytic copper bath and the following three-step protocol was performed:

1) Induction or cold entry: the substrate was immersed in the electrolytic copper bath during 5 seconds without any electrical bias applied to it.

2) Application of periodic rectangular pulsed current with a period of 1.25 second (0.75 s off and 0.5 s on) between 0 A and a current of 3.5 A or 5 A.

3) Hot exit: the substrate was taken out from the copper electrolytic bath under electrical bias at a level similar to the pulse bias.

Results

By performing the above experimental protocol on a blanket substrate, with pulses of either −3.5 A or −5 A, we obtained a continuous and uniform copper layer with a mean thickness of 450 nm and a mean sheet resistance of 0.055 ohm/square.

Figure 3:
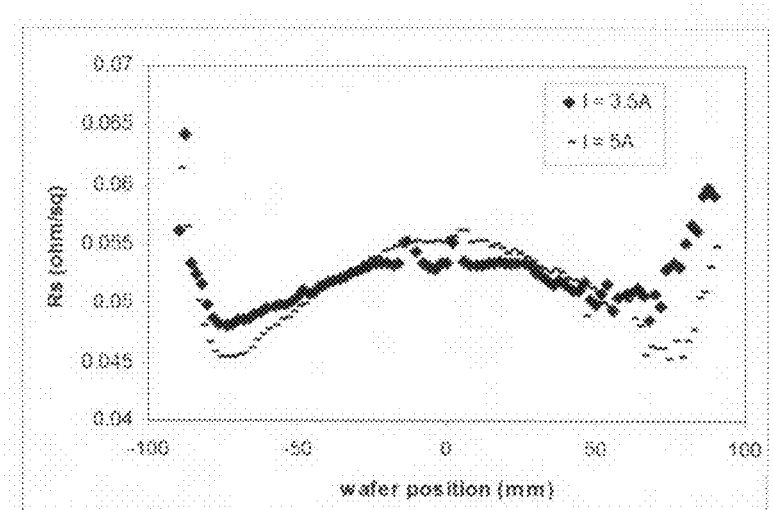
FIG. 3 is a graph showing sheet resistance profiles obtained with different pulse strengths.

Sheet resistance diameter profiles after copper deposition are presented in FIG. 3.

Higher growth rates were obtained with −5 A pulses (2.3-2.5 nm/s) compared to −3.5 A pulses (1.8-2 nm/s). Adhesion on such copper layers is very high, measured better than 10 $J/m^2$.

EXAMPLE 6

The substrate used in this example consisted of a 200 mm silicon wafer, coated with a 400 nm layer of silicon dioxide deposited by plasma-enhanced chemical vapor deposition (PECVD). The silicon dioxide layer was coated with various layers:
- 10 nm of tantalum nitride (TaN) deposited by PVD, with 15 nm of pure tantalum deposited on top of it by PVD (sheet resistance of 21 ohm/sq).
- 15 nm of tantalum nitride (TaN) deposited by PVD (sheet resistance of 100 ohm/sq).
- 5 nm of tantalum nitride (TaN) deposited by PVD (sheet resistance of 380 ohm/sq).

These layers are copper diffusion barriers such as those used in damascene structures.

A blanket substrate was used for sheet resistance (Rs) measurement by 4-point probe. Adhesion on a blanket substrate is measured by a variable force stud-pull test. These substrates were used without any pre-treatment.

The electrolytic copper bath of the invention in this particular example was an aqueous solution having a pH of 6 and containing $CuSO_4,(H_2O)_5$ with a concentration of 65 mM, and ethylenediamine with a concentration of 95 mM.

Equipment 200 mm wafers were processed in an industrial tool commercialized for copper electroplating applications. This tool was equipped with an electrochemical cell having its own solution circulation system. The electrochemical cell housed a copper anode and a diffuser installed between the anode and the wafer which is the cathode. A sealed ring was used to provide current to the wafer. This current is delivered by a power supply unit capable of delivering (32V, 5 A) maximum.

After copper deposition, the wafer was cleaned in a SRD (spin rinse dry) chamber located on the same tool.

Experimental Protocol

The substrate was immersed in the electrolytic copper bath and the following three-step protocol was performed:

1) Induction or cold entry: the substrate was immersed in the electrolytic copper bath during 5 seconds without any electrical bias applied to it.

2) Application of periodic rectangular pulsed current with a period of 1.25 second (0.75 s off and 0.5 s on) between 0 A and a current of −3.5 A.

3) Hot exit: the substrate was taken out from the copper electrolytic bath under electrical bias at a level similar to the pulse bias.

Results

By performing the above experimental protocol on various blanket substrates with sheet resistances in the range 20-380 ohm/sq, we obtained a continuous and uniform copper layers with a mean thickness of 450 nm and a mean sheet resistance in the range 0.055-0.06 ohm/square (see Table 1).

Adhesion on such copper layers is very high, measured better than 10 $J/m^2$.

TABLE 1 sheet resistance and growth rate measured on various wafers for 450 nm of deposited copper.

| Substrate | Mean sheet resistance (ohm/sq) | Mean sheet resistance after copper deposition (ohm/sq) | Growth rate (nm/s) |
| --- | --- | --- | --- |
| TaN/Ta (10 nm/15 nm) | 21 | 0.059 | 1.8 |
| TaN 15 nm | 100 | 0.055 | 1.9 |
| TaN 5 nm | 380 | 0.060 | 1.9 |

As can be seen from the above description, the single step copper filling method according to the invention is obviously more advantageous, due to the use of a single formulation, compared to the multi-step and multi-solution procedures of the prior art.

The invention claimed is:

1. A method for electroplating copper directly onto a copper diffusion barrier layer deposited on a patterned substrate and, in the same step of the method, filling surface features of the patterned substrate with copper, said method comprising:
   providing an electrolytic copper bath containing, in solution in a solvent, a source of copper ions with a concentration of between 45 and 200 mM, and at least one copper complexing agent, which is an aliphatic polyamine having 2 to 4 amine functions, with a concentration of between 30 and 200 mM; a copper/complexing agent(s) molar ratio being of between 0.2 and 2;
   bringing said copper diffusion barrier layer of said substrate into contact with said electrolytic copper bath,
   applying an electrical bias to the substrate for a duration adjusted according to the thickness of copper to be electroplated, so as to electroplate copper directly onto the copper diffusion barrier layer and fill the surface features of the patterned substrate with copper, and
   removing the substrate from said electrolytic copper bath.

2. The method of claim 1, wherein the electrical bias has the form of a series of periodic pulses of current or potential, having a magnitude depending on the barrier.

3. The method of claim 1, wherein the electrical bias has the form of a continuous potential or current polarization having a magnitude depending on the barrier material.

4. The method of claim 1, wherein said aliphatic polyamine is selected from the group consisting of alkylene-polyamines and polyalkylene-polyamines having 2 to 4 amine functions.

5. The method of claim 4, wherein said aliphatic polyamine is selected from the group consisting of ethylenediamine and diethylenetriamine.

6. The method of claim 4, wherein the aliphatic polyamine is at least one selected from the group consisting of ethylenediamine, diethylenetriamine, triethylenetetramine, and dipropylenetriamine.

7. The method of claim 1, wherein said electrolytic copper bath essentially contains, in solution in a solvent a source of copper ions with a concentration of between 45 and 100 mM, and at least one copper complexing agent which is an aliphatic polyamine having 2 to 4 amine functions with a concentration of between 60 and 200 mM; the copper/complexing agent(s) molar ratio being of between 0.3 and 1.5.

8. The method of claim 1, wherein, in the aforementioned electrolytic copper bath, the aforementioned solvent is chosen from water and hydroalcoholic mixtures and the source of copper ions is a copper salt.

9. The method of claim 8, wherein the copper salt is selected from the group consisting of copper sulphate, copper chloride, copper nitrate and copper acetate.

10. The method of claim 8, wherein the copper salt is copper sulphate.

11. The method of claim 1, wherein the aforementioned substrate is a silicon wafer in the course of fabricating integrated circuits, the surface of which, to be coated, is that of a copper diffusion barrier layer selected from the group consisting of a bilayer based on tantalum nitride/tantalum (TaN/Ta), a tantalum nitride (TaN) layer, a tantalum silicon nitride (TaSiN) layer, a titanium (Ti) layer, a titanium nitride (TiN) layer, a titanium silicon nitride (TiSiN) layer, a tungsten nitride (WN) layer, a tungsten carbon nitride (WCN) layer, a cobalt-based layer and a ruthenium-based layer.

12. The method of claim 1, wherein the concentration of the source of copper ions is between 45 and 100 mM.

13. The method of claim 1, wherein the concentration of the at least one copper complexing agent is between 60 and 200 mM.

14. The method of claim 1, wherein the copper/complexing agent(s) molar ratio is between 0.3 and 1.5.

15. The method of claim 1, wherein the concentration of the source of copper ions is between 50 and 80 mM.

16. The method of claim 1, wherein the concentration of the copper complexing agent is between 90 and 180 mM.

17. The method of claim 1, wherein the copper/complexing agent(s) molar ratio is between 0.4 and 0.8.

* * * * *